US006405347B1

(12) United States Patent
McBride

(10) Patent No.: US 6,405,347 B1
(45) Date of Patent: Jun. 11, 2002

(54) METHOD AND APPARATUS FOR DETERMINING THE MAXIMUM PERMITTED AND MINIMUM REQUIRED WIDTH OF A FEEDBACK FET ON A PRECHARGE NODE

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/343,624

(22) Filed: Jun. 30, 1999

(51) Int. Cl.[7] .............................................. G06F 17/50
(52) U.S. Cl. .............................................. 716/4; 716/5
(58) Field of Search ........................... 716/4, 5; 326/95, 326/97, 98, 102

(56) References Cited

U.S. PATENT DOCUMENTS

| | | | |
|---|---|---|---|
| 5,258,919 A | * 11/1993 | Yamanouchi et al. | 716/11 |
| 5,691,652 A | * 11/1997 | Miller, Jr. et al. | 326/26 |
| 5,793,228 A | * 8/1998 | Evans | 326/98 |
| 6,097,207 A | * 8/2000 | Bernstein et al. | 326/9 |
| 6,163,173 A | * 12/2000 | Storino et al. | 326/98 |
| 6,166,985 A | * 12/2000 | McDaniel et al. | 365/230.06 |

OTHER PUBLICATIONS

Bisdounis et al, "Modeling the Dynamic Behavior of Series–Connected MOSFETS for Delay Analysis of Multiple–Input CMOS Gates," IEEE, Jun. 1998, pp. VI–342–VI–345.*

* cited by examiner

Primary Examiner—Vuthe Siek

(57) ABSTRACT

In accordance with one aspect of the invention a method is provided for determining a minimum FET width for a feedback FET on a precharge node. In one embodiment, the method identifies the NFET (ignoring evaluation NFETs) of each NFET tree having the largest width value. then sums width the values of these largest NFETs in at least one NFET tree associated with the precharge node, to determine an effective NFET width (N) of NFETs in the at least one NFET tree. Then, the method computes a minimum value of a PFET width (P) for the feedback FET, for a specified N:P ratio (R), in accordance with the equation: P=N/R. In accordance with another aspect of the invention a method is provided for determining a maximum FET width for a feedback FET on a precharge node. In one embodiment, the method evaluates at least one NFET tree, in accordance with a second circuit model, to determine an effective NFET width (N). This evaluation includes computing an effective width value of each NFET tree, and determining which NFET tree has the largest effective width. The method then computes a maximum value of an effective PFET width (P2) for the feedback FET tree, for a specified N2:P2 ratio (R2), in accordance with the equation P2=N2/R2.

19 Claims, 15 Drawing Sheets

ELEMENT { ~~~
    Pass FET
    Feedback Element
    ~~~}

NODE { ~~~
    Clock
    Precharge Node
    Interstitial Precharge Node
    ~~~~}

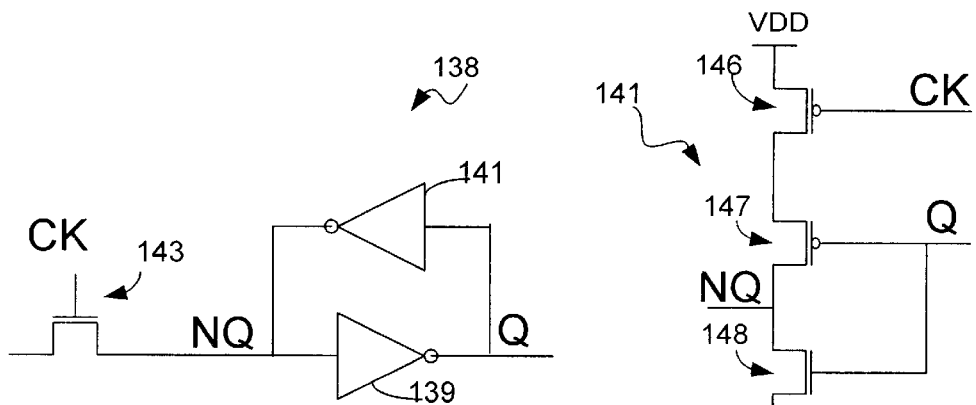
FIG. 5A
FIG. 5B
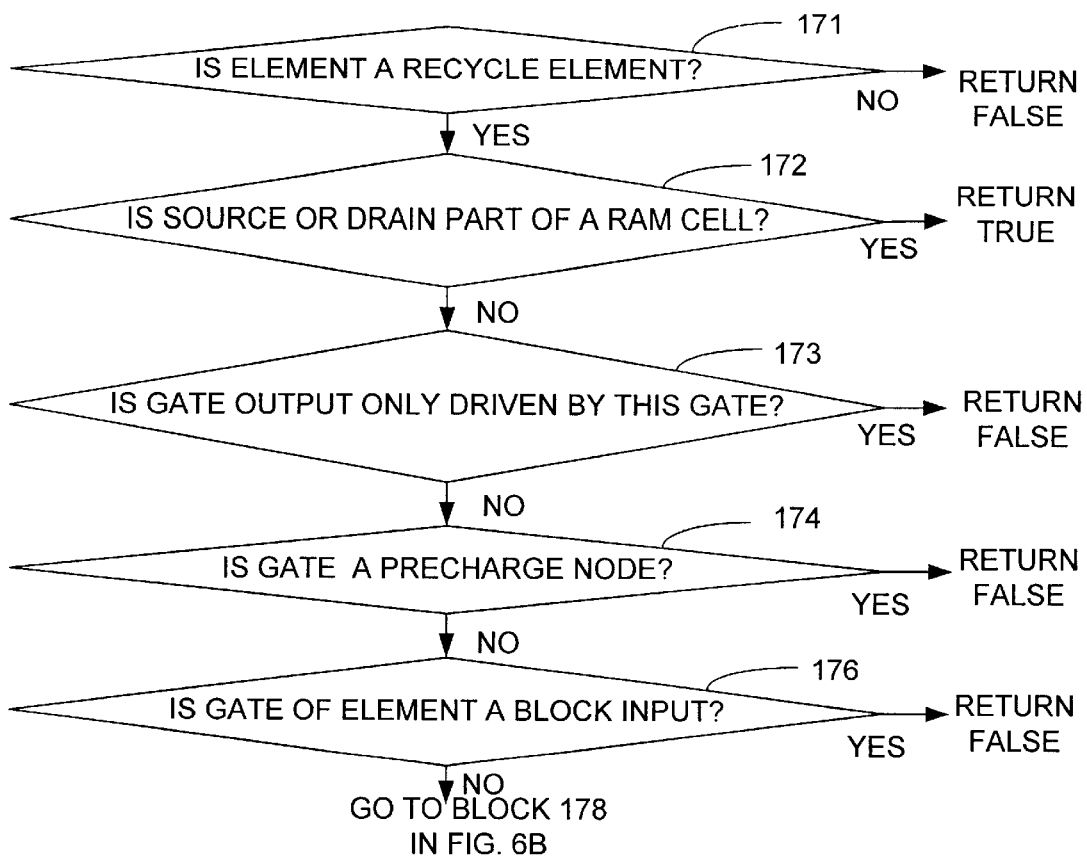
FIG. 6A

METHOD AND APPARATUS FOR DETERMINING THE MAXIMUM PERMITTED AND MINIMUM REQUIRED WIDTH OF A FEEDBACK FET ON A PRECHARGE NODE

TECHNICAL FIELD OF THE INVENTION

The present invention generally relates to computer-aided circuit design systems and, more particularly, to a method and apparatus for evaluating the design quality of a network of nodes in an integrated circuit to determine the required strength of a feedback FET on a precharge node.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations., hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill. by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. One such design quality may relate to certain gate sizes. Specifically, there are certain circuit configurations in which a designer may wish to ensure that a gate is large enough to output sufficient drive strength for its intended purpose, while at the same time not being too large, such that it would prevent surrounding circuit components from operating properly.

One such situation arises in a configuration where a feedback FET is associated with a precharge node. It is often desirable to ensure that the feedback FET is not so large that it prevents the precharge node from being pulled down by NFETs tied to the precharge node, yet the feedback FET must be large enough to hold the charge on the precharge node. It will be appreciated that, particularly in large circuit designs, it would be desirable for this determination to be made in an automated fashion by evaluating a netlist file, so that the design engineer need not manually evaluate a schematic diagram.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is directed to a system and method for determining the maximum permissible and minimum required FET widths for a feedback FET on a precharge node. In accordance with one aspect of the invention a method is provided for determining a minimum FET width or a feedback FET on a precharge node. In one embodiment, the method sums width values of individual NFETs in at least one NFET tree associated with the precharge node, to determine an effective NFET width (N) of NFETs in the at least one NFET tree. Specifically, the method identifies the NFET of each NFET tree having the largest width value (ignoring evaluation NFETS), and sums these largest NFET values. Then, the method computes a minimum value of a PFET width (P) for the feedback FET, for a specified N:P ratio (R), in accordance with the equation: $P=N/R$.

In accordance with one aspect of the invention a method is provided for determining a maximum FET width for a feedback FET on a precharge node. In one embodiment, the method evaluates at least one NFET tree, in accordance with a second circuit model, to determine an effective NFET width (N). This evaluation includes computing an effective width value for each NFET tree, and then determining which NFET tree has a minimum effective width. Finally, the method computes a maximum value of an effective PFET width (P2) for the feedback FET tree, for a specified N2:P2 ratio (R2), in accordance with the equation $P2=N2/R2$.

Other features and advantages of the present invention will become apparent from the following description, drawings and claims.

BRIEF DESCRIPTION OF THE DRAWINGS

The accompanying drawings incorporated in and forming a part of the specification, illustrate several aspects of the present invention, and together with the description serve to explain the principles of the invention. In the drawings:

FIG. 5A is a schematic block diagram of a circuit comprising a recycle loop.

FIG. 5B is a schematic diagram of one of the inverters shown in FIG. 4A.

FIGS. 6A–6C together represent a flow chart which provides a detailed illustration of the method of the present invention in accordance with one embodiment for determining whether an element is a feedback element.

DETAILED DESCRIPTION OF THE INVENTION

Figure 1:
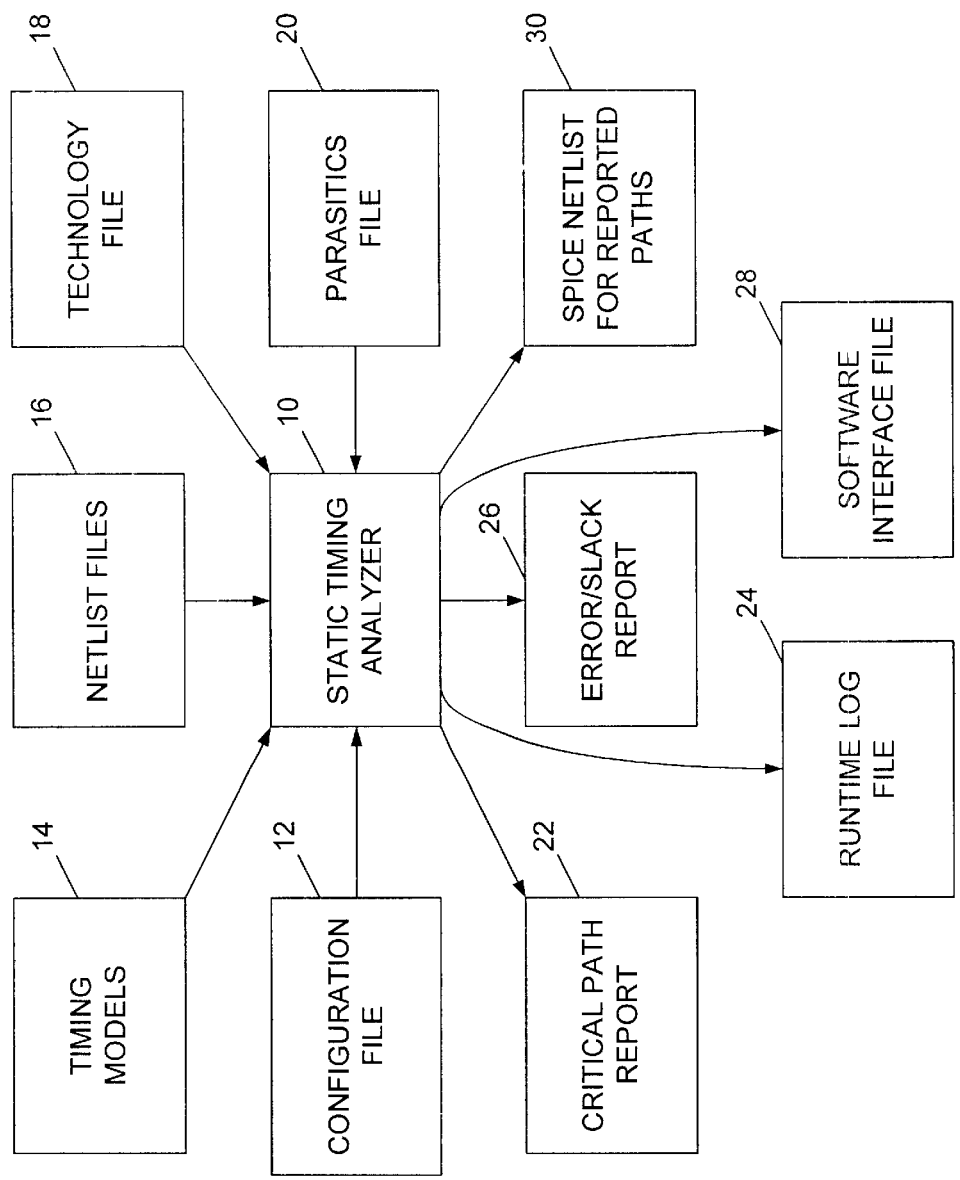
FIG. 1 is a block diagram of a static timing analyzer system, which is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations.

Figure 2:
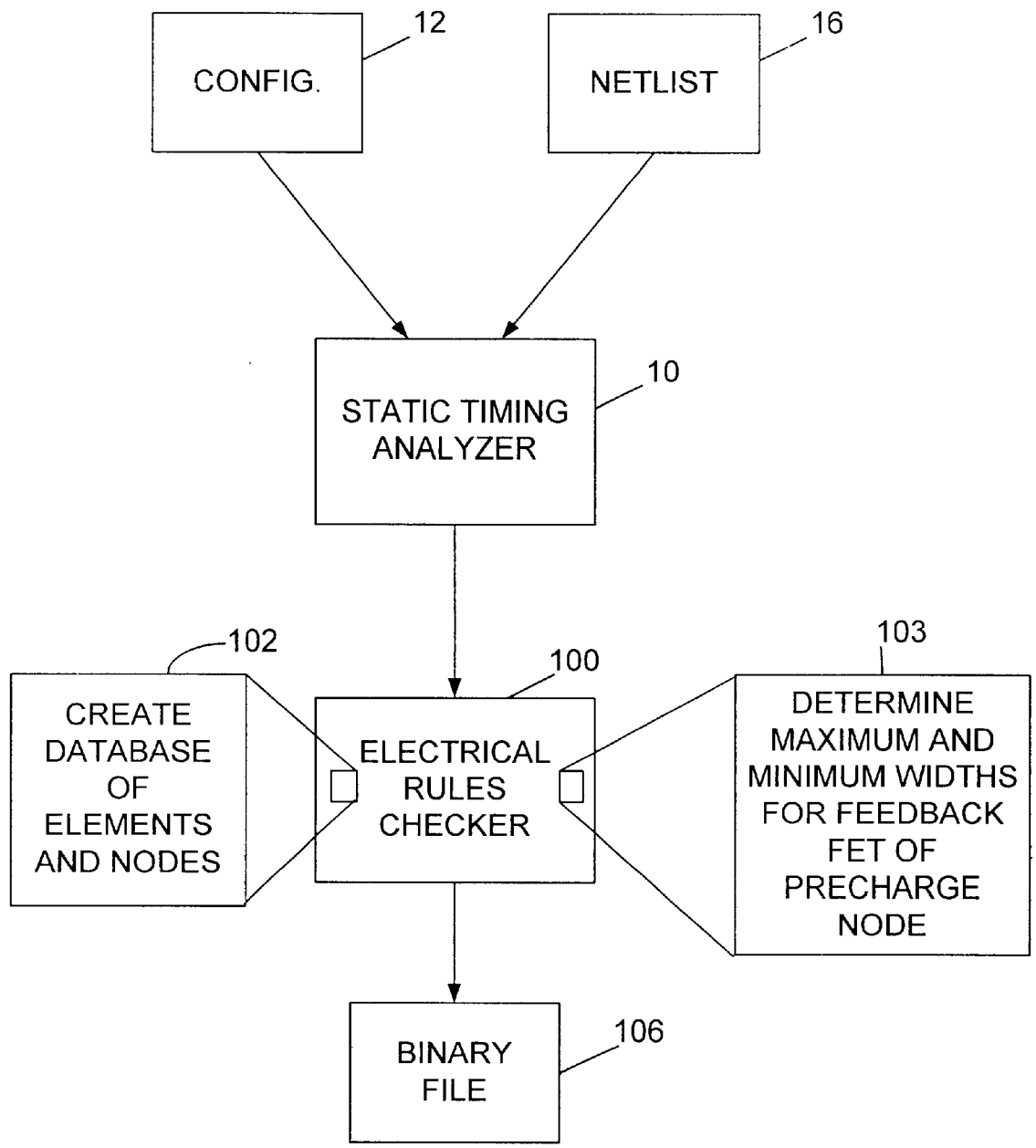
FIG. 2 is a block diagram illustrating the orientation of the electrical rules checker of the present invention in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker program 100 of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks.

The manner in which this database is generated will now be discussed below with respect to FIGS. 3A–3C. For purposes of illustration, it will be assumed that the static timing analyzer 10, shown in FIG. 2 and discussed above, is the Pathmill static timing analyzer, in order to provide an example of one possible implementation of the present invention. However, those skilled in the art will understand that the electrical rules checker 100 of the present invention and the database of the present invention are not limited to use with any particular program.

The Pathmill static timing analyzer provides an application program interface (API) which allows the Pathmill static timing analyzer to communicate with the electrical rules checker 100 of the present invention. This API allows code external to the Pathmill program to be linked to the Pathmill program so that the external code and the Pathmill program itself comprise one executable which can be run as a single program. The electrical rules checker 100 of the present invention utilizes this API to obtain information from the Pathmill static timing analyzer which can be utilized by the electrical rules checker 100 to generate the database of the present invention, as indicated by block 102. Information within this database may then be utilized by the rules checker program 100 to perform the task 103 of determining the required drive strength of a feedback element of a precharge node.

Prior to the database of the present invention being generated, the Pathmill program runs and identifies circuit characteristics of the circuit under consideration such as, for example, FET direction, node types, latches, dynamic gates, clocks, rise and fall times, etc. Before the Pathmill program terminates, it calls the electrical rules checker 100 of the present invention. The Pathmill program has a feature commonly referred to as "hooks", which allows the Pathmill program to call routines at various stages of execution. Once the Pathmill program has finished identifying the characteristics mentioned above, the Pathmill program calls the electrical rules checker 100 of the present invention. The electrical rules checker 100 of the present invention, through this series of subroutine calls, creates its own database of the circuit under consideration.

Figure 3A:
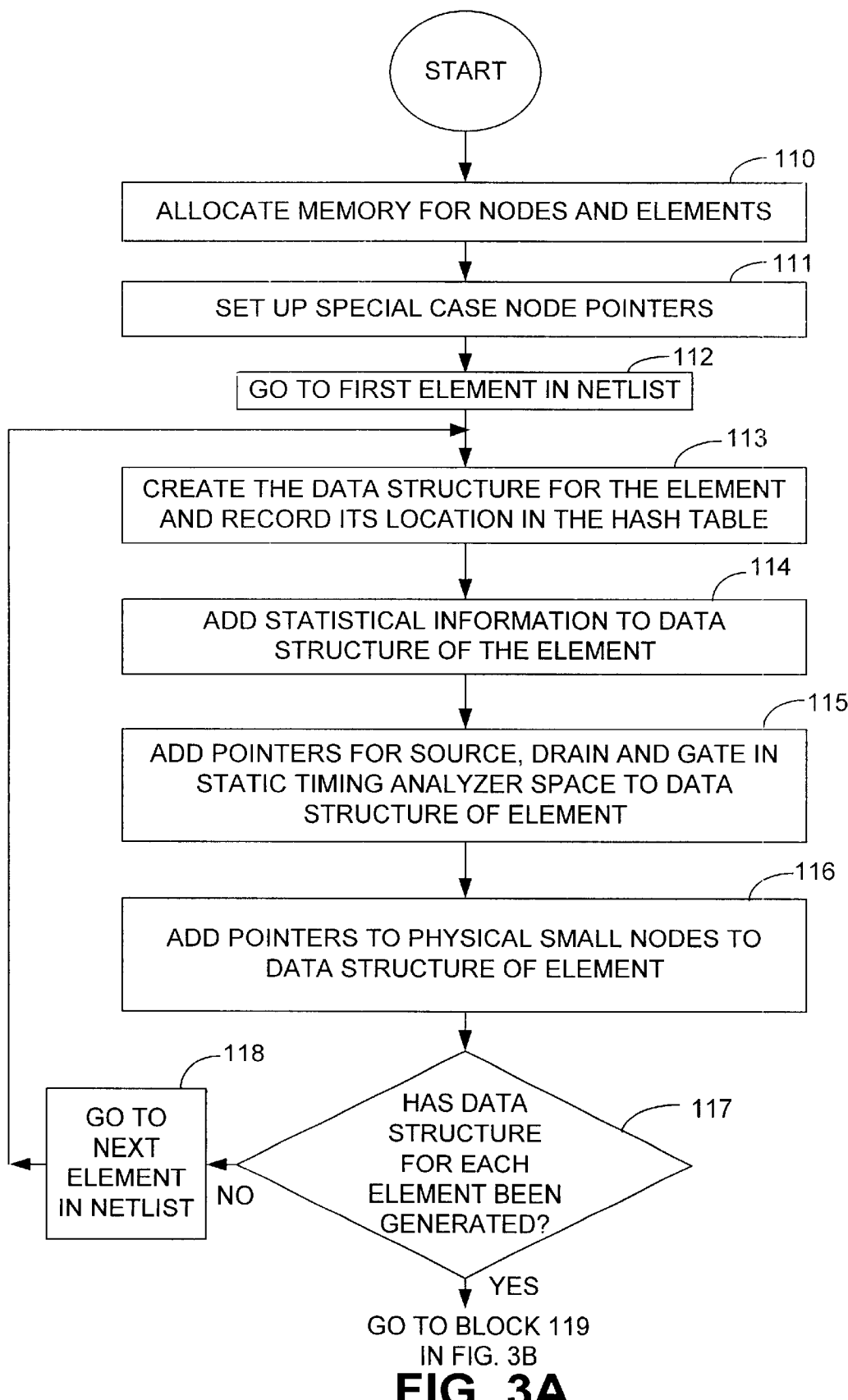
FIGS. 3A–3C together form a flow chart which illustrates the method of the present invention for generating the database of the present invention which can be utilized by the electrical rules checker of the present invention shown in FIG. 2 to perform rules checking tasks.
Figure 3B:
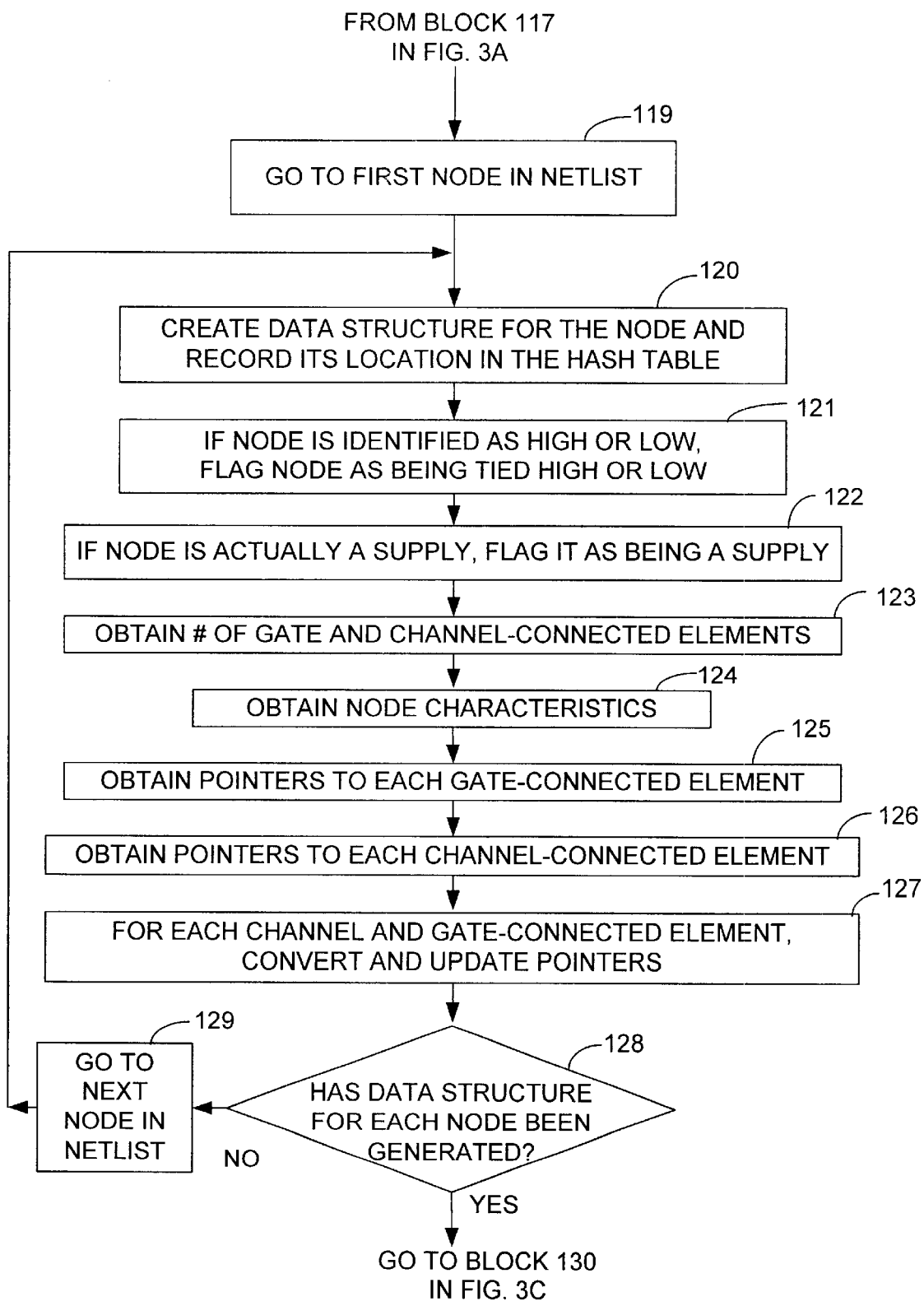

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example. the width of the element. the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116. the pointers corresponding to these small nodes are added to the data structure of the element. A determination is then made at block 117 as to whether or not data structures for all of the elements have been generated. If not. the next element in the netlist is obtained, as indicated by block 118, and the process returns to block 113. If so, the process proceeds to block 119 in FIG. 3B.

Once the data structures for the elements have been generated, the data structures for the nodes are generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags declared or actual high nodes as high and declared or actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figures 3C, 4A, 4B:
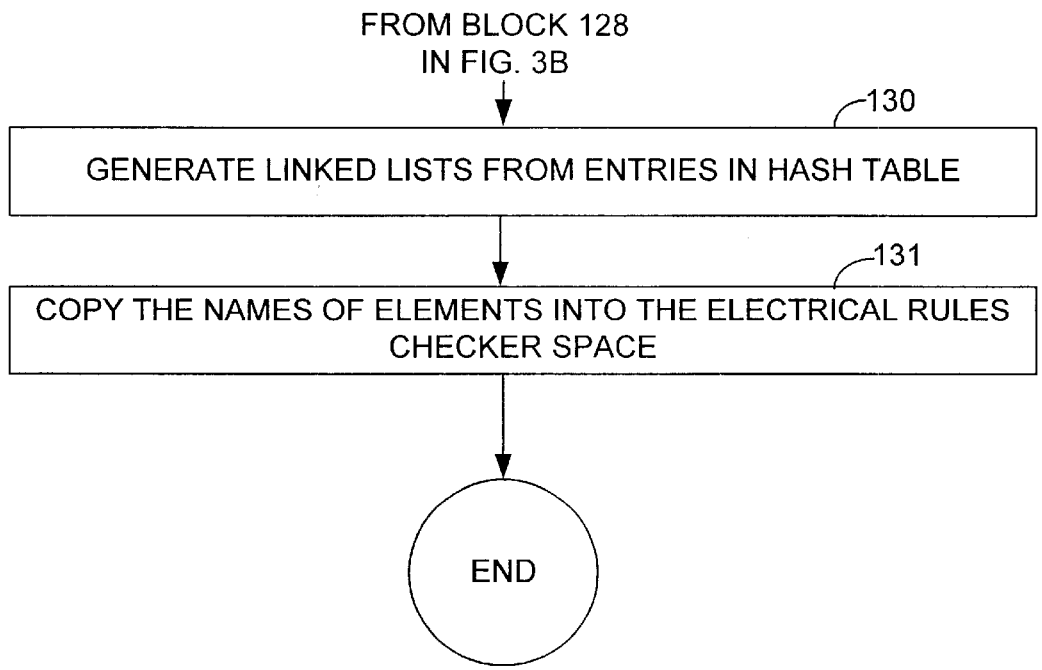
FIG. 4A is a diagram illustrating a portion of a data structure of a circuit element, depicting certain flags that may be set, in accordance with the invention.
FIG. 4B is a diagram illustrating a portion of a data structure of a circuit node, depicting certain flags that may be set, in accordance with the invention.

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention when searching for an element or node in the database of the present invention.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PlathMill API. The database of the present invention is comprised as the binary file 106 shown in FIG. 2.

Once the database of the present invention has been generated in the manner described above, the electrical rules checker 100 of the present invention utilizes this database to perform the rules checking tasks. However, it should be noted that the generation of the database is not critical to the present invention, as will be understood by those skilled in the art. Utilization of the database of the present invention enables the rules checker 100 to maximize efficiency in performing its tasks and reduces the number of API calls to the timing analyzer 10.

The database that is generated may be structured so that various element and node features may be accessed via a data structure. Indeed, both an element data structure and a node data structure may be defined. As illustrated in FIG. 4A, the element data structure may define a large number of parameters (or flags), including whether the current element is a pass FET, a feedback FET, etc. Similarly, a node data structure (FIG. 4B) may be defined and include a number of flags, including a flag that indicates whether the node is a clock node, a precharge node, an interstitial precharge node, a predischarge node, etc.

As stated above, the electrical rules checker 100 evaluates a circuit to determine the maximum permissible and minimum required FET widths of a feedback FET to a precharge node. As a part of this process, the rules checker 100 of the present invention analyzes a network of nodes to determine whether or not FETs in the network are feedback elements. The manner in which this is accomplished by the rules checker 100 will now be discussed with respect to the circuits shown in FIGS. 5A and 5B and with reference to the flow charts of FIGS. 6A–6C. The circuits of FIGS. 5A and 5B will be used to illustrate the general case wherein a series of general checks, which are demonstrated by the flow charts of FIGS. 6A–6C, are performed to determine whether or not an element is a feedback element.

FIG. 5A illustrates a recycle loop 138 comprised of inverters 139 and 141 which are connected to a pass FET 143 which has a clock connected to its gate. FIG. 5B illustrates a schematic diagram of the inverter 141 shown in FIG. 5A. It can be seen from FIG. 5B that the PFET 147 is a feedback element since it is contained in the recycle loop 138 and is channel-connected to the input NQ of the recycle loop 138. FET 147 will be evaluated in accordance with the method illustrated in FIGS. 6A–6C in order to demonstrate the manner in which the rules checker 100 performs a sequence of checks to determine whether or not a FET is a feedback element. The method of FIGS. 6A–6C could equally be applied to any of the elements in the circuit shown in FIG. 5A. The result would be that FET 143 and any FETs in inverter 139 would be determined not to be feedback elements and only FETs 147 and 148 in FIG. 5B would be found to be feedback elements.

Figure 6B:
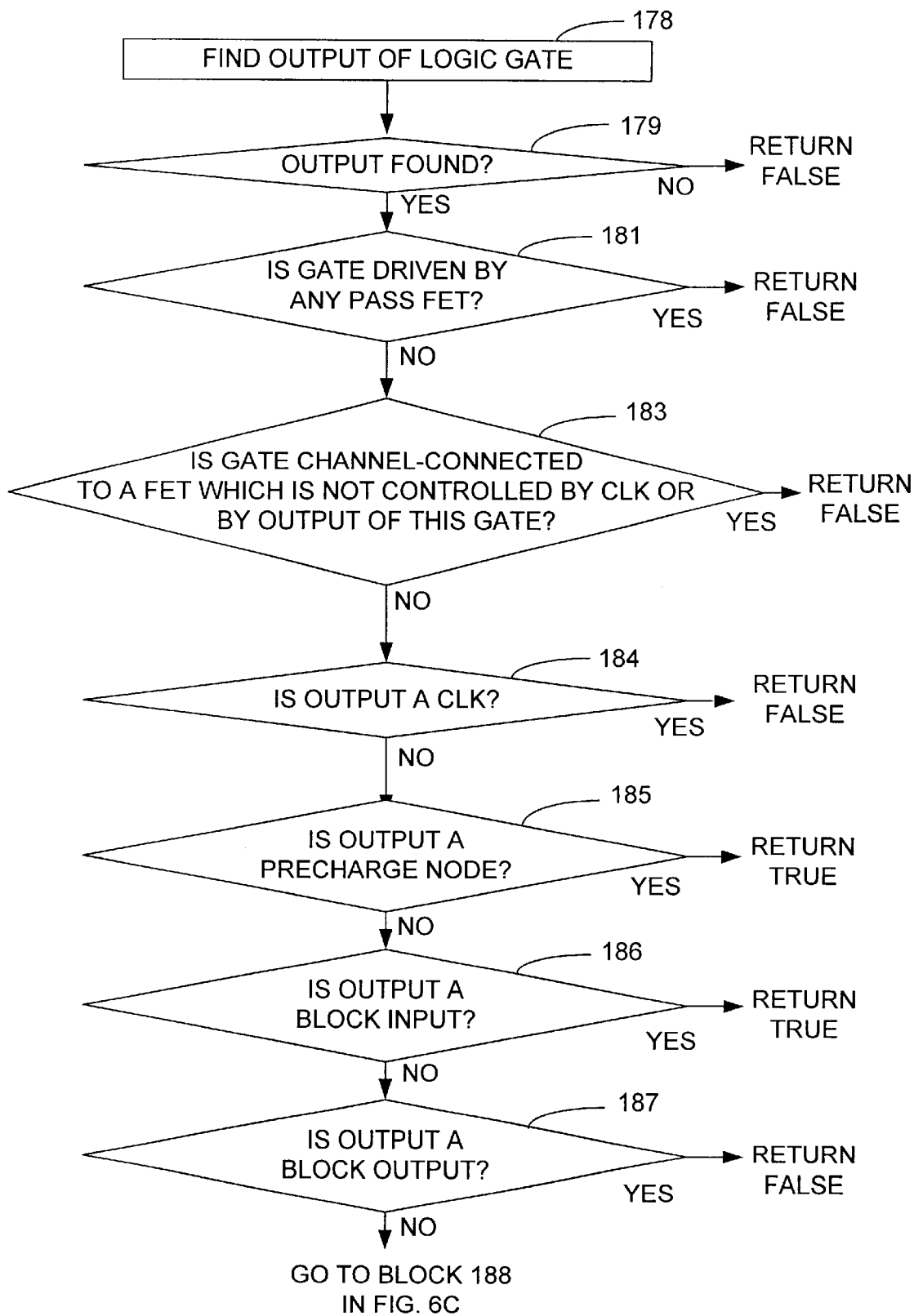
Figure 6C:
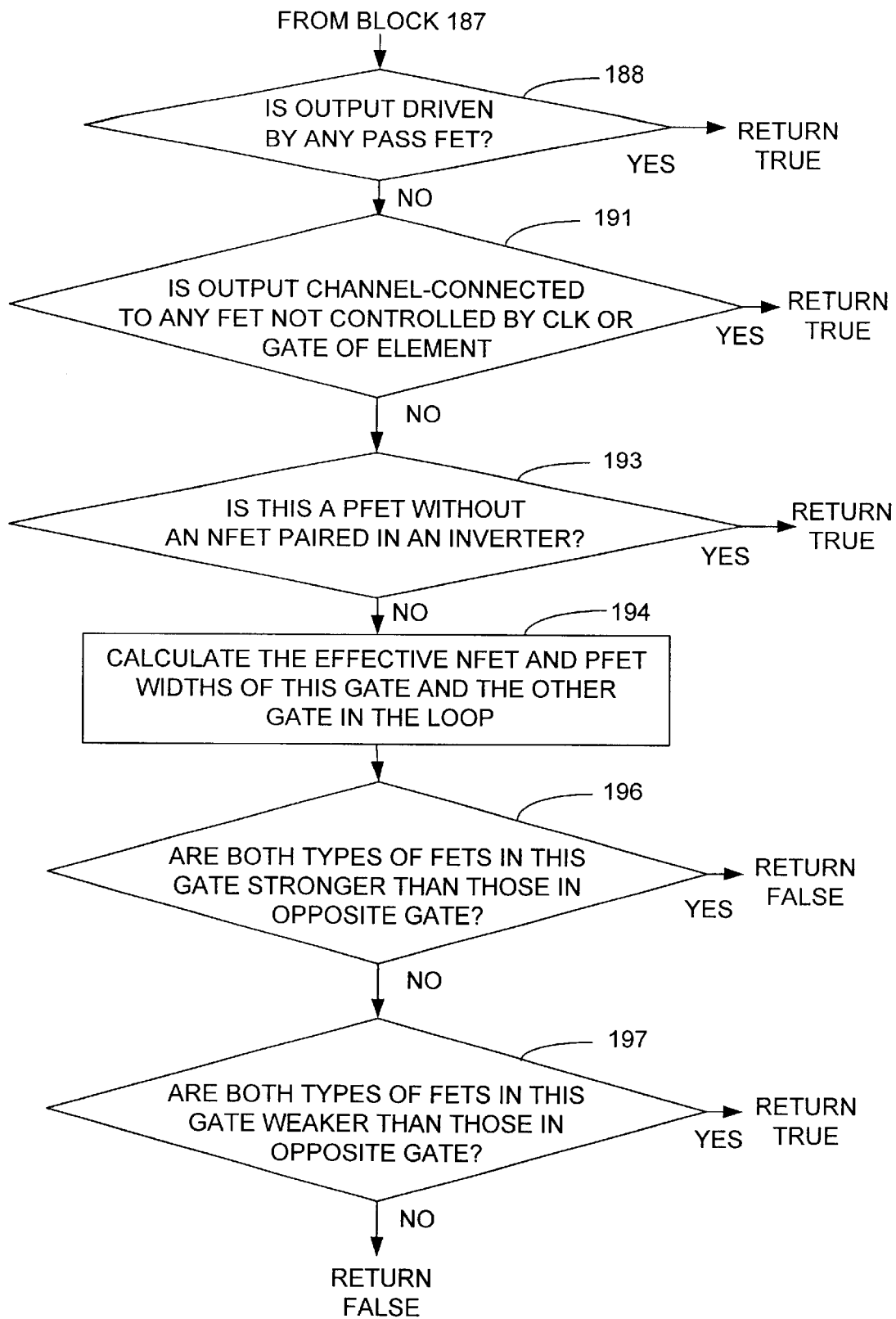

Many of the checks performed by the rules checker 100 that are shown in FIGS. 6A–6C utilize information obtained directly from the timing analyzer 10 (e.g., Pathmill) and/or information generated by the rules checker 100 and stored in the aforementioned database. In performing some of the checks, the rules checker 100 simply evaluates flags that have been received from the timing analyzer 10 and placed in the database by the rules checker 100. Other checks are performed by the rules checker 100 using the information stored in the database to make a particular determination.

The first step in the process for determining whether a FET is a feedback element is to determine whether or not the element under investigation is a recycle element, as indicated by block 171. If the element under investigation is not part of a recycle loop, it cannot be a feedback element. The rules checker 100 determines whether or not the FET 147 is part of a recycle loop by determining whether or not the FET 147 is contained in an inverter which is cross-coupled with another inverter, which is the case shown in FIG. 5A. If the element being evaluated is not part of a recycle loop, it cannot be a feedback element. In this case. the rules checker 100 would return false, thus indicating that the element under investigation is not a feedback element.

In this example, the rules checker 100 will determine that the element 147 is part of a recycle loop since it is contained in inverter 141 which is cross-coupled with inverter 139. The process will then proceed to the step represented by block 172 and the rules checker 100 will determine whether the source or drain of the element 147 is part of a RAM cell. If the source drain is part of a RAM cell, it can be assumed that the element under investigation is a feedback element. Therefore, if the rules checker 100 determines that the source or drain is part of a RAM cell, the rules checker 100 will return true indicating that the FET under investigation is part of a feedback element.

The rules checker 100 determines whether or not the circuit 138 is a RAM cell by determining whether or not a pass FET, such as NFET 143, that is channel-connected to the latch node NQ is channel-connected to one or more other pass FETs. If so, the pass FET being evaluated is part of a RAM cell. Therefore, in this example, the rules checker 100 will determine that the FET 147 is not part of a RAM cell since there are no pass FETS channel-connected to pass FET 143 shown in FIG. 5A. Therefore, the process will proceed to block 173.

At block 173, the rules checker 100 determines whether or not the output of gate 141 is driven only by gate 141. In this example, the output NQ is not being driven only by gate 141 because it is also being driven by pass FET 143. Therefore, the decision of block 173 will resolve to NO and the process will proceed to block 174. At block 174, the rules checker 100 determines whether or not the gate of the FET being evaluated is a precharge node. If so, the rules checker 100 determines that the FET is not a feedback element and returns false. This is because the gate of a feedback element is never precharged. Precharging normally occurs only in the forward loop. If the rules checker 100 determines that the gate of FET 147 is not a precharge node, the process proceeds to block 176.

Precharge nodes exist in circuits that have been designed using dynamic domino logic, which is well-known to those skilled in the art. Precharge nodes are nodes that are channel-connected to a PFET which has its gate connected to the clock and its source connected to the supply voltage, VDD. Since the gate of FET 147 is not connected to the drain of a PFET which has its gate connected to the clock and its source connected to VDD, the rules checker 100 will determine that the gate of FET 147 is not a precharge node and the process will proceed to block 176. Precharge nodes are identified by Pathmill by flags, which are stored in the database. These flags are utilized by the rules checker 100 to perform the check of block 174. Alternatively, the rules checker 100 could analyze elements connected to the gate of the element being evaluated in order to determine whether or not the gate is a precharge node.

At block 176, the rules checker 100 determines whether or not the gate of the FET being evaluated is a block input. A flag in the database identifies nodes that are block inputs. Since the gate of FET 147 is within a larger circuit, the gate of FET 147 will not be identified as a block input and, therefore, the process will proceed to block 178 in FIG. 6B.

At block 178, the rules checker 100 attempts to locate the output of the gate 141 shown in FIG. 4A that comprises the FET being evaluated. At block 179, the rules checker 100 determines whether or not an output has been found. In certain cases, the output of the gate may be connected to various configurations of NFETs and PFETs and, consequently, the rules checker 100 will not be able to identify an output of the gate. This will indicate that the gate is not an inverter, and since only inverters are allowed in the recycle loop, the inability to identify an output of the gate will indicate that the FET 147 comprised in the gate is not a feedback element. Therefore, the rules checker 100 will return false, thus indicating that the FET comprised in the gate for which an output could not be identified is not a feedback element. However, in this example, the rules checker 100 will identity node NQ as the output of gate 141 and the process will proceed to block 181.

At block 181, the rules checker 100 will determine whether or not the gate of the FET being evaluated is driven by a pass FET. The rules checker will make this determination by determining whether or not any pass FETs are channel-connected to the gate of the FET being evaluated and whether or not the directionality of the pass FET is toward the gate of the FET being evaluated. If so, the rules checker 100 will determine that the FET being evaluated is not a feedback element and will return false. If the rules checker 100 determines that the gate of the FET being evaluated is not channel-connected to any pass FETs, the process will proceed to block 183. Pass FETs are FETs that simply pass a signal, such as the FET 143 shown in FIG. 4A. Pass FETs arc used to connect circuits together and they are identified by flags in the information received by the rules checker 100 from Pathmill. In this example, since there are no pass FETs channel-connected to the gate of FET 147, the process will proceed to block 183.

At block 183, the rules checker 100 will determine whether or not the gate of the FET being evaluated is channel-connected to another FET which is not controlled either by the clock or by the output of the gate comprising the FET being evaluated. Therefore, in this example, the rules checker 100 will first determine whether or not the gate of FET 147 is channel-connected to any FETs. Since the gate of FET 147 is only channel-connected to FETs that are in logic gate 139, the rules checker will determine whether or not gate 13, which comprises those FETs, is controlled either by the clock or by the output of the gate 141 comprising the FET 147 being evaluated. Therefore, if the node NQ is either connected directly to a clock or corresponds to the output of the gate 141 comprising FET 147, the decision of the block 183 will resolve to NO. Since NQ corresponds to the output of gate 141, the decision of block 183 will resolve to NO and the process will proceed to block 184.

At block 184, the rules checker 100 determines whether or not the output of the gate 141 comprising the FET 147 being evaluated is connected to the clock. Pathmill provides flags to the rules checker 100 which are stored in the database and utilized by the rules checker to determine whether or not nodes are connected to clocks. In this example, since NQ is not a clock, the process proceeds to block 185 where a determination is made as to whether or not the output of the gate 141 comprising the FET 147 is a precharge node. Since the output of gate 141 is not channel-connected to a PFET which has its gate connected to a clock and its source connected to VDD, the output of gate 141 is not a precharge node. Therefore, the process will proceed to block 186.

At block 186, the rules checker 100 will determine whether or not the output of gate 141 comprising FET 147 is a block input. As stated above, a flag in the database identifies block inputs. Since the node NQ is internal to the circuit comprising the recycle loop 138 and the pass FET 143, the node NQ will not be identified in the database as a block input and the process will proceed to block 187. As with block inputs, the database also comprises flags which identify block outputs. The rules checker 100 utilizes these flags to determine whether or not the node NQ is a block output. Since the output of gate 141 is not a block output, the process will proceed to block 188 in FIG. 6C.

At block 188, the rules checker 100 determines whether or not the output NQ of the gate 141 is driven by a pass FET. Since NQ is driven by pass FET 143, the decision of block 188 resolves to YES and the rules checker 100 returns true indicating that the FET 147 comprised by gate 141 is a feedback element. Therefore, in this example, the task of determining, whether or not the FET 147 is a feedback element would be complete and the rules checker 100 could begin evaluating a different element in the circuit or performing some other task. However, in order to illustrate all of the steps in the process, the remaining steps will be discussed.

At block 191, the rules checker 100 determines whether or not the output of the gate comprising the FET being evaluated is channel-connected to any FET which is not controlled either by the clock or by the gate of FET being evaluated. The output NQ is channel-connected to a FET 148 shown in FIG. 4B and to the FET 143 shown in FIG. 4A. However, since the FET 148 is controlled by the gate of FET 147 and since the FET 143 is controlled by the clock, the decision of block 191 will resolve to NO and the process will proceed to block 193.

At block 193, the rules checker 100 determines whether or not the FET being evaluated is a PFET which is not paired with an NFET in an inverter. In other words, the rules checker 100 determines whether or not the FET being evaluated is a PFET and, if so, whether or not the PFET is channel-connected to an NFET. If the rules checker 100 determines that the FET is a PFET and that it is not channel-connected to an NFET controlled by the same signal as the PFET, the rules checker 100 returns true indicating that the PFET is a feedback element. Since FET 147 is channel-connected to NFET 148, the decision of block 193 will resolve to NO and the process will proceed to block 194.

At block 194, the rules checker 100 calculates the effective widths of the NFETs and PFETs of the gates 139 and 141. The rules checker 100 utilizes the widths of the elements which have been stored in the database to calculate the effective NFET and PFET widths for each of the gates. The effective width $W_E$ of the PFET network shown in FIG. 4B is calculated as: $W_E=1(1/W_1+1/W_2)$, where $W_1$ and $W_2$ represent the widths of the FETs. This equation is also used to calculate the effective width of the NFET network shown in FIG. 4B, where $W_1$ and $W_2$ represent the widths of the NFETs.

Once the effective widths have been calculated, the rules checker proceeds to block 196. At block 196, the rules checker 100 determines whether or not the PFET network and the NFET network in the gate containing the FET being evaluated is stronger than the PFET network and the NFET network in other gate in the recycle loop 138. The strength of a FET is equal to its width divided by its length. The strengths of the PFET and NFET networks in each of the gates 139 and 141 are assumed to the effective widths of the PFET and NFET networks, which were calculated at block 194.

Therefore, in this example, the rules checker 100 determines whether the PFET and NFET networks of the gate 141 are stronger than the PFET and NFET networks of gate 139, if so, the rules checker 100 returns false, thus indicating that the element being evaluated is not a feedback element. This is because the return loop cannot be stronger than the forward loop. If the decision of block 201 resolves to NO, the process will proceed to block 197. At block 197, the rules checker 100 determines whether the PFET and NFET networks in the gate containing the element being evaluated are weaker than those in the opposite gate. If so, the rules checker 100 returns true, thus indicating that the element being evaluated is a feedback element. If not, the process returns false, indicating that the element is not a feedback element.

Figure 7:
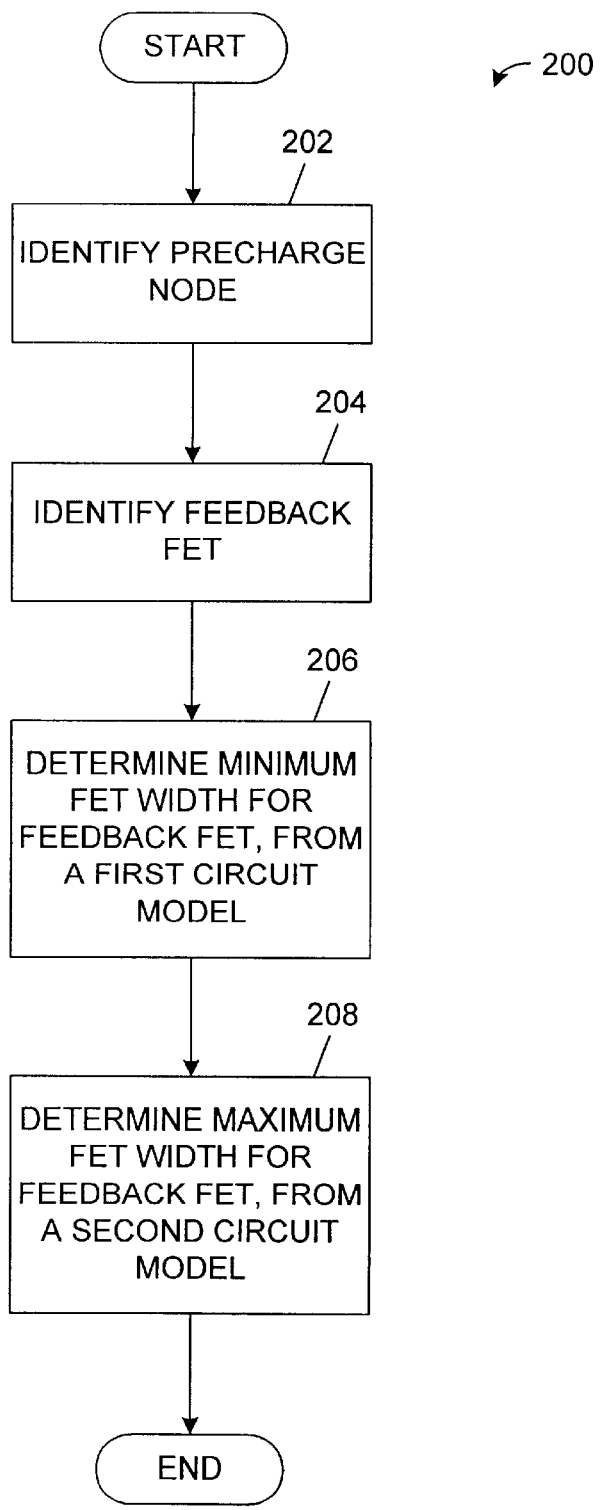
FIG. 7 is a flowchart illustrating a top level functional operation of a method operating in accordance with the invention.

Having described certain environmental features and aspects of a system and method, the discussion will now turn to the broader concepts and features of the present invention. In this regard, reference is made to FIG. 7, which is a flow chart 200 illustrating the top level functional operation of a method constructed in accordance with one aspect of the invention. Specifically, a method constructed in accordance with one aspect of the invention operates to determine the minimum and maximum FET widths for a feedback FET connected to a precharge node. Accordingly, the method first evaluates elements and nodes within a netlist to identify a precharge node (Step 202). As is known, PathMill may be utilized to identify precharge nodes. Alternatively, precharge nodes may be separately identified by a system or method carrying out an embodiment of the invention.

Thereafter, the method evaluates the circuitry surrounding the precharge node to identify a feedback FET (Step 204). Assuming that a feedback FET is identified, the method then performs an evaluation to determine the minimum FET width of the feedback FET (Step 206). In a manner that will be described in more detail below, this evaluation is performed by utilizing a first circuit model of the precharge node and surrounding circuitry, including FET trees and the feedback FET. Thereafter, the maximum FET width of the feedback FET is determined using a second circuit model (Step 208).

In short, the minimum FET width specifies the minimum required FET width in order for the feedback FET to possess sufficient drive strength to sustain a charge on the precharge node. Likewise, the maximum FET width of the feedback FET specifies a maximum drive strength for the feedback FET, so that the pull down FET tree(s) is guaranteed to have sufficient drive strength to pull down the precharge node.

Figure 8:
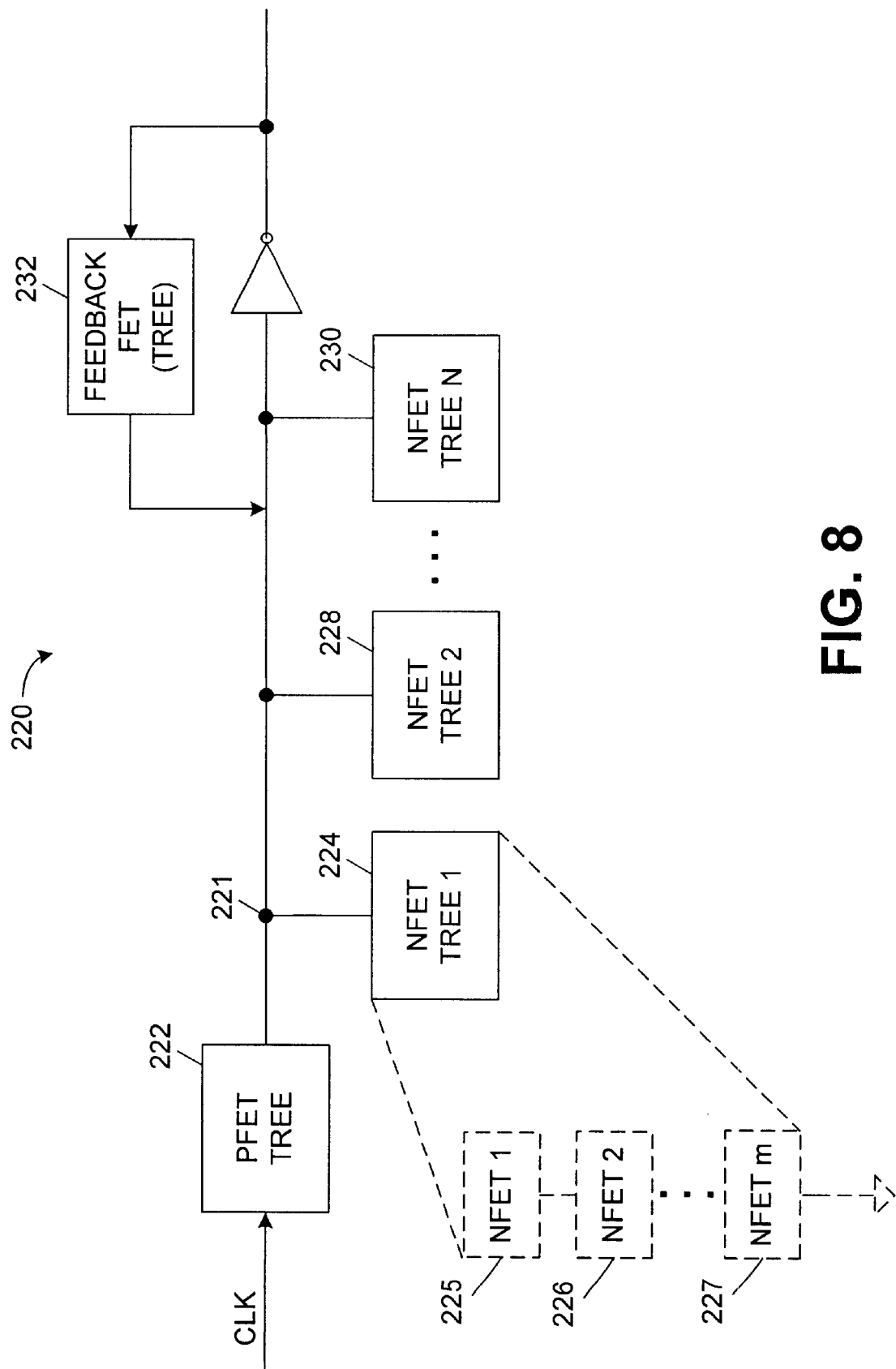
FIG. 8 is a block diagram illustrating circuitry surrounding a precharge node.

To better illustrate the circuitry associated with the method of the present invention, reference is made to FIG. 8, which is a block diagram illustrating circuitry 220 surrounding a precharge node 221. Specifically, and as will be appreciated by persons skilled in the art, the precharge node is defined by circuitry including at least one PFET (or PFET tree) 222 and at least one NFET tree 224. 228, and 230, wherein the PFET 222 is driven by a clock input. As will be further appreciated, each NFET tree 224, 228, and 230 may include one or more NFETs 225. 226 and 227 that are channel connected between the precharge node 221 and ground. Consistent with the broader concepts and teachings of the present invention, a system constructed in accordance with the teachings herein may dynamically identify the precharge node 221 by evaluating the netlist. Alternatively, the precharge node 221 may be determined simply by reference to a stored value in a data structure (see FIG. 4B). As mentioned above, PathMill may be utilized to identify precharge nodes within a netlist, and mark them accordingly.

In addition to identifying a precharge node 221, the method of the preferred embodiment also identifies an element as a feedback FET 232. Indeed, if no feedback element is associated with a given precharge node 221, the method of the present invention (i.e., determining the minimum and maximum FET widths for a feedback FET) need not be performed. The feedback FET 232 may be identified in a variety of manners, consistent with the broader concepts of the present invention. One such manner has been described above in connection with FIGS. 5 and 6. To more specifically illustrate a circuit identified in accordance with the invention, reference is now made to FIG. 9, which is a schematic diagram illustrating a circuit 250 surrounding a precharge node 251. Specifically, the circuit illustrated in FIG. 9 includes a PFET 252 channel connected with a first NFET tree comprising NFETs 254, 256, and 258. A second NFET tree comprising NFETs 260 and 262 are also channel connected to the precharge node 251. The circuit 250 also includes an output inverter 264 and feedback FET 266. Further, the gate node of PFET 252 is driven by a clock signal. The evaluation of this circuit configuration will be described in more detail in connection with FIGS. 13 and 14 below.

Figure 9:
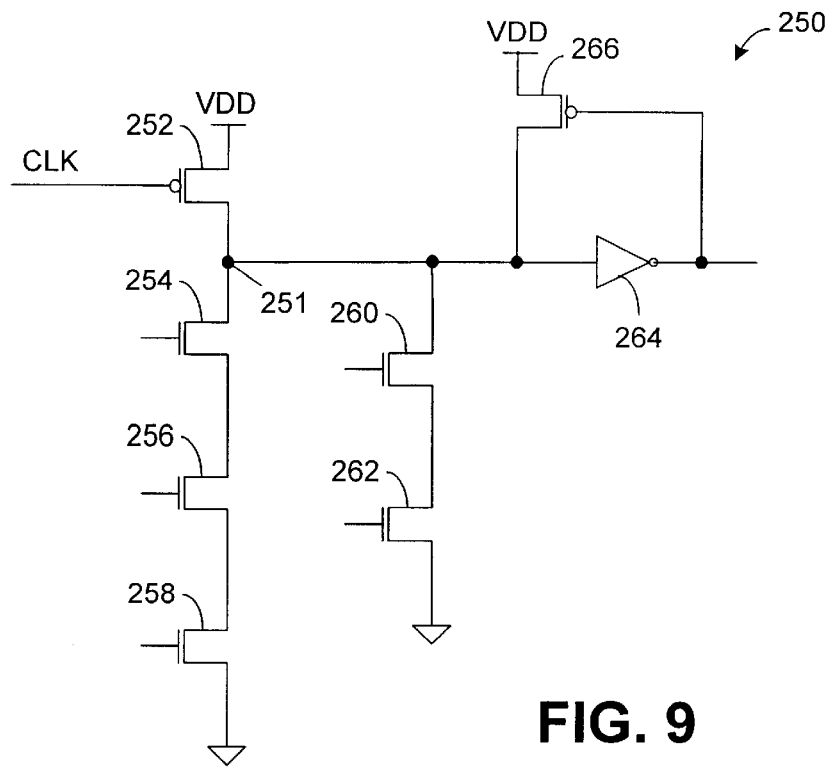
FIGS. 9 and 10 are schematic diagrams illustrating slightly alternative circuit configurations of a precharge node having a feedback FET.
Figure 10:
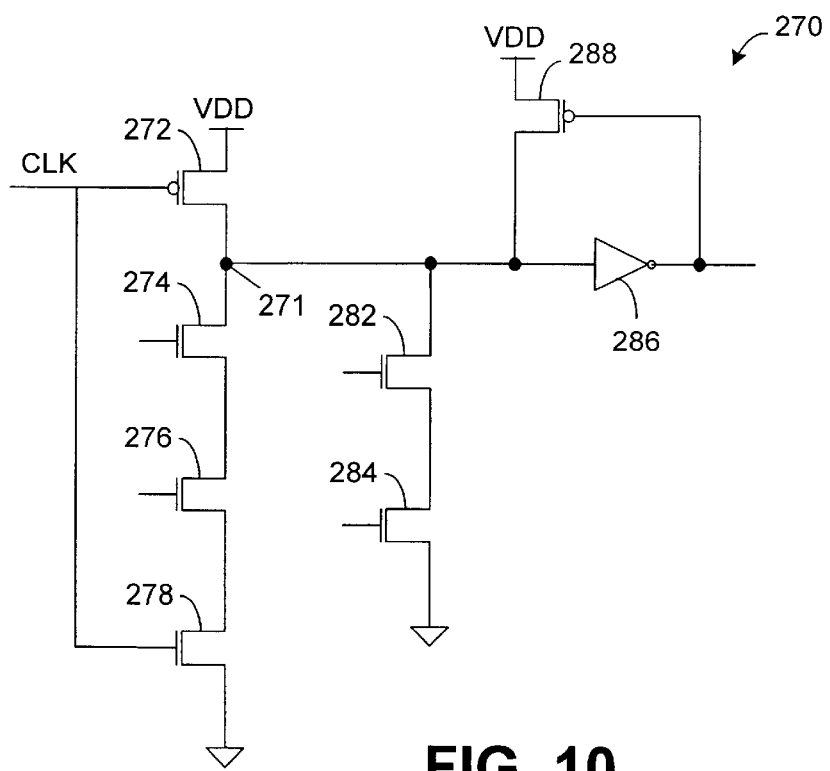

Reference is now made briefly to FIG. 10, which illustrates a similar. but alternative circuit configuration 270. Specifically, the circuit 270 defines a precharge node 271 and a feedback FET 288 like that of FIG. 9. However, the computation of FET widths for feedback FET 288 will result in a slightly different computation. More particularly, the circuit 270 includes PFET 272 having a gate node that is driven by a clock signal. In addition, a first NFET tree includes NFETs 274, 276, and 278, channel connected between the precharge node 271 and ground. Likewise, a second NFET tree, having NFETs 282 and 284, is channel connected between the precharge node 271 and ground. Finally, and like the circuit of FIG. 9, the circuit 270 includes an output inverter 286 and a feedback FET 288. The difference between the circuit of FIG. 9 and the circuit of FIG. 10, as illustrated, is that the clock signal also drives the gate node of FET 278. This FET is sometimes referred to by those skilled in the art as an evaluation FET. As will be described in more detail below, the evaluation FET does not effect the computation for the minimum size of the FET width for feedback FET 288. In contrast, the FET 258 does effect the computation of the minimum FET width of feedback FET 266.

In accordance with one embodiment of the invention, the minimum FET width of a feedback FET for a precharge node is computed using a first circuit model. A second circuit model is utilized for computing the maximum FET width for a PFET feedback element. In this regard, it will be appreciated that a feedback element on a precharge node may comprise more than a single FET. For example, it could comprise a PFET-NFET pair configured in an inverter configuration. However, the feedback element will include at least one PFET. If more than one PFET elements comprise the feedback element, then an equivalent PFET tree may be constructed and evaluated, and the PFET tree will define the total drive strength of the collective PFETs.

Figure 11:
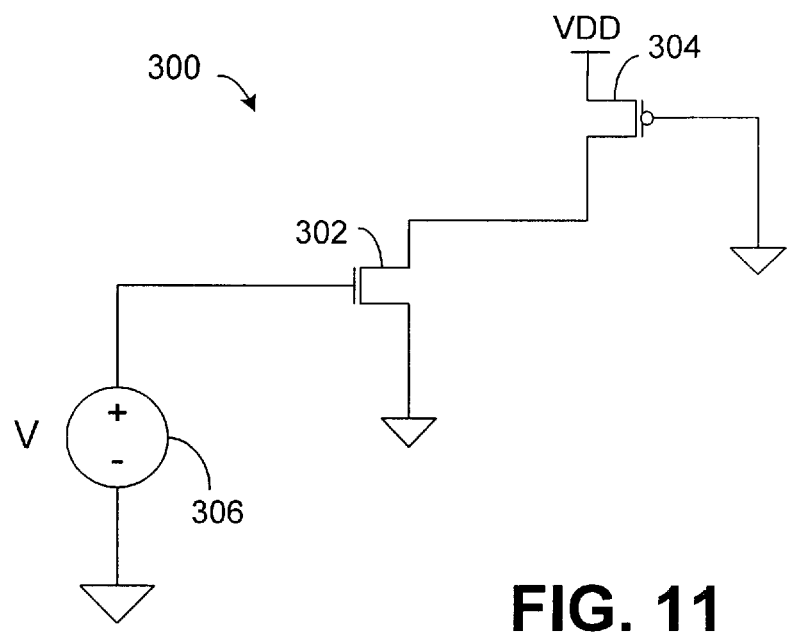
FIGS. 11 and 12 are schematic diagrams illustrating similar circuit models used to evaluate the maximum and minimum width values of a feedback FET, in accordance with the invention.

In regard to the evaluation made by the present invention. the first circuit model utilized is illustrated in FIG. 11. Specifically, this circuit configuration includes an NFET 302, a PFET 304, and a voltage source 306, configured as illustrated. The NFET 302, as will be described below, is computed to have an effective NFET width. From this effective width, a PFET width is also computed for the PFET 304. PFET 304 corresponds to the feedback PFET, or PFET tree (if there is more than one feedback PFET). Further, a voltage source 306 is illustrated. The voltage value for this voltage source represents an offset voltage between the supply driving the NFET tree, and the supply driving the clock generation circuitry. Typically, the value of this voltage source will be very small.

In short, the effective width of NFET 302 is a summation of widths from the NFET trees connected to the precharge node, excluding any evaluation FETs. Therefore, the effective width of NFET 302 for the circuit of FIG. 9 is the summation of the widths of the largest NFET among NFETs 254, 256, and 258, and the largest NFET among NFETs 260 and 262. In contrast, the effective width of NFET 302 for the circuit configuration of FIG. 10 equals the summation of the largest NFET among NFETs 274 and 276, and the largest NFET among NFETs 282, and 284. Thus, the width of evaluation NFET 278 is not included in the summation.

By way of example, assume the NFETs all have the same length and the following widths:

| NFET Ref. | Width (microns) |
| --- | --- |
| NFET 254 | 4 |
| NFET 256 | 4 |
| NFET 258 | 40 |
| NFET 260 | 8 |
| NFET 262 | 8 |
| NFET 274 | 4 |
| NFET 276 | 4 |
| NFET 278 | 40 |
| NFET 282 | 8 |
| NFET 284 | 8 |

For the circuit of FIG. 9, the effective (summation) NFET width, according to the first circuit model, is 48 microns. Assuming the maximum N:P ratio was specified to be 5, then the minimum P value would be P=48/5, or 9.6 microns. In contrast, the minimum P value for the circuit of FIG. 10, where the evaluation FET 278 is ignored, is different. Specifically. the effective NFET width for the circuit of FIG. 10 is 12 microns. Therefore the minimum P value (assuming a specified maximum N:P ratio of 5) is P=12/5, or 2.4 microns.

Figure 12:
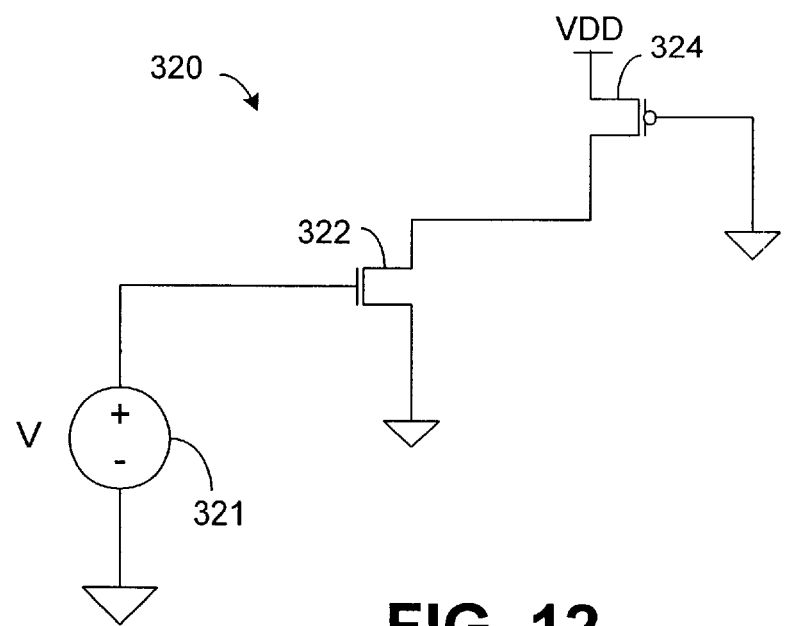

Referring now to FIG. 12, a second circuit model is shown, which is utilized for evaluating the maximum width of a feedback FET to a precharge node. Like the circuit 300 of FIG. 11, the circuit 320 of FIG. 12 includes a voltage source 321, an NFET 322, and a PFET 324. The voltage source 321 represents an offset or a noise voltage differential the high voltage output between the NFETs of the NFET trees and the clock signal, due to potentially differing values of the respective VDD supplies for the different FET components. The NFET 322 is computed to represent an effective FET width of the various NFETs in the NFET trees, including any evaluation FETs. Likewise, the PFET 324 is an equivalent PFET to the feedback PFETs, if there is more than one feedback PFET.

If more than one NFET tree exists, then each tree is evaluated to determine which has the smallest effective FET width. This tree represents the NFETs that will have the most difficulty in pulling the precharge node to ground, and therefore the worst case scenario if it is the only NFET tree to "fire." The effective width of NFET 322 of this tree is computed using the following equation:

$$N2 = Lp/((L1/w1)+(L2/w2)+ \ldots +(Ln/wn)),$$

where w1, w2, . . . , wn are width values for a first NFET, a second NFET, . . . , and an nth NFET, where Lp is a FET length specified by a fabrication process, and L1, L2, . . . , Ln are FET length values for the first NFET, the second NFET, . . . , and the nth NFET, in the NFET tree identified as having the maximum width summation. In one embodiment, the length values may be assumed to be all of the same length. As a result, the equation may be approximated as:

$$N2 = 1/((1/w1)+(1/w2)+ \ldots +(1/wn)).$$

By way of example, and using the same FET values listed in the table above, the maximum width for the feedback FET in the circuit of FIG. 9, may be computed as follows: N2=1/((1/4)+(1/4)+(1/40))=40/21=1.9 microns. Recall that the value N2 is calculated based upon the NFET width values from the NFET tree that will turn on the easiest (the NFET tree with the greatest width summation).

It should be appreciated that certain assumptions and simplifications have been made in order to better illustrate the principal concepts of the present invention. For example, if the structure of the NFET trees are more complex, then certain equivalent circuit models may be constructed. Alternatively, effective FET widths may be computed. In this regard, the effective FET width of two FETs connected in channel parallel fashion may differ, between the circuits of model 1 of FIG. 11 and model 2 of FIG. 12. For circuit model 1 FETs, an effective FET width of FETs disposed in channel parallel is obtained by summing the respective FET widths, whereas an effective FET width of FETs disposed in series is obtained by taking the larger of the width values. For circuit model 2 FETs, an effective FET width of FETs disposed in channel parallel is obtained by taking the smaller of the two width values, whereas an effective FET width of FETs disposed in series is obtained by computing the product of the FET widths, divided by the sum of the FET widths. It should be understood that complex FET configurations of parallel and series connected FETs may first be resolved into effective FET width values.

Figure 13:
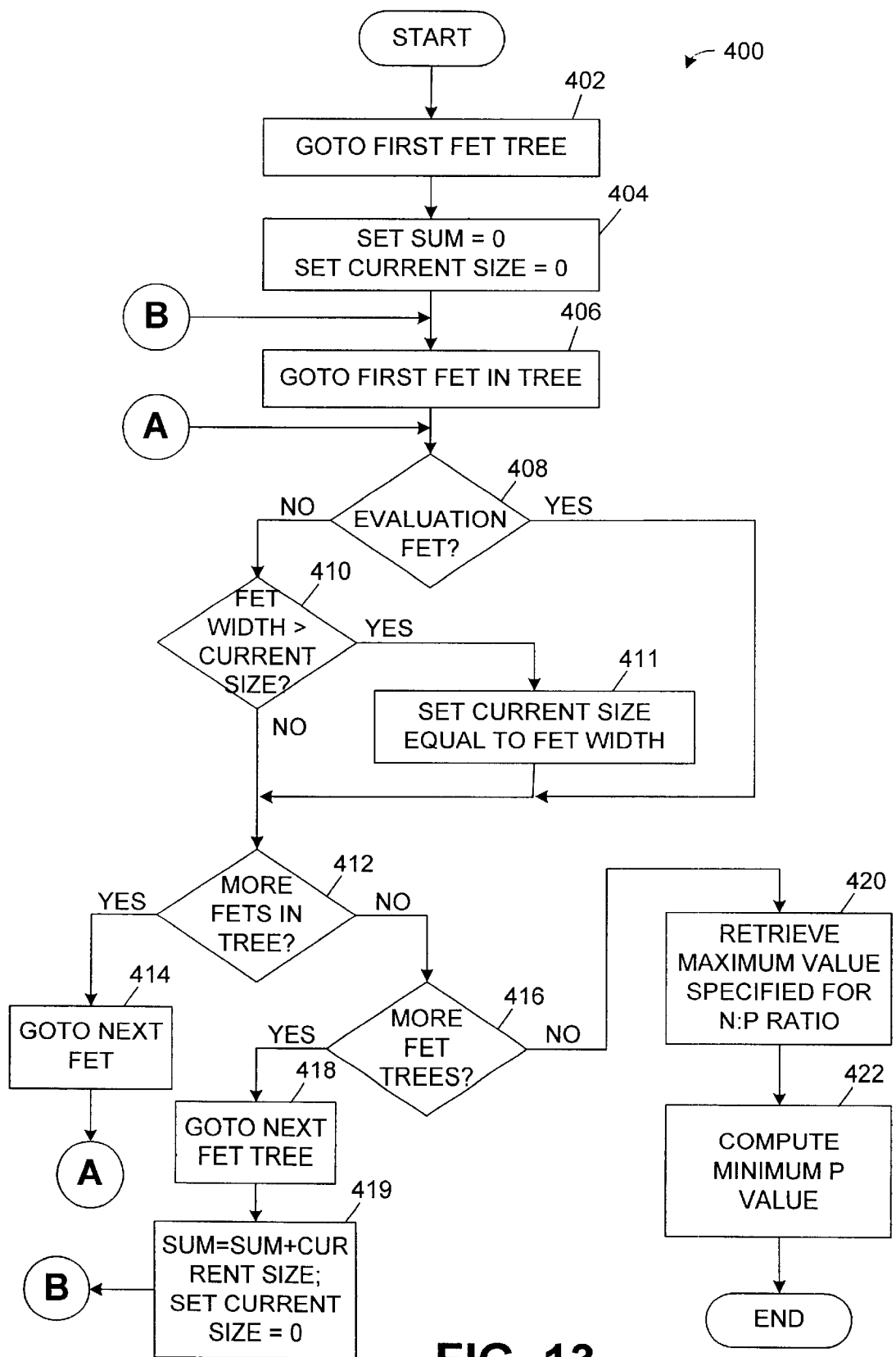
FIG. 13 is a flowchart illustrating a top level functional operation of a method for determining the minimum FET width for a feedback FET, in accordance with the invention.
Figure 14:
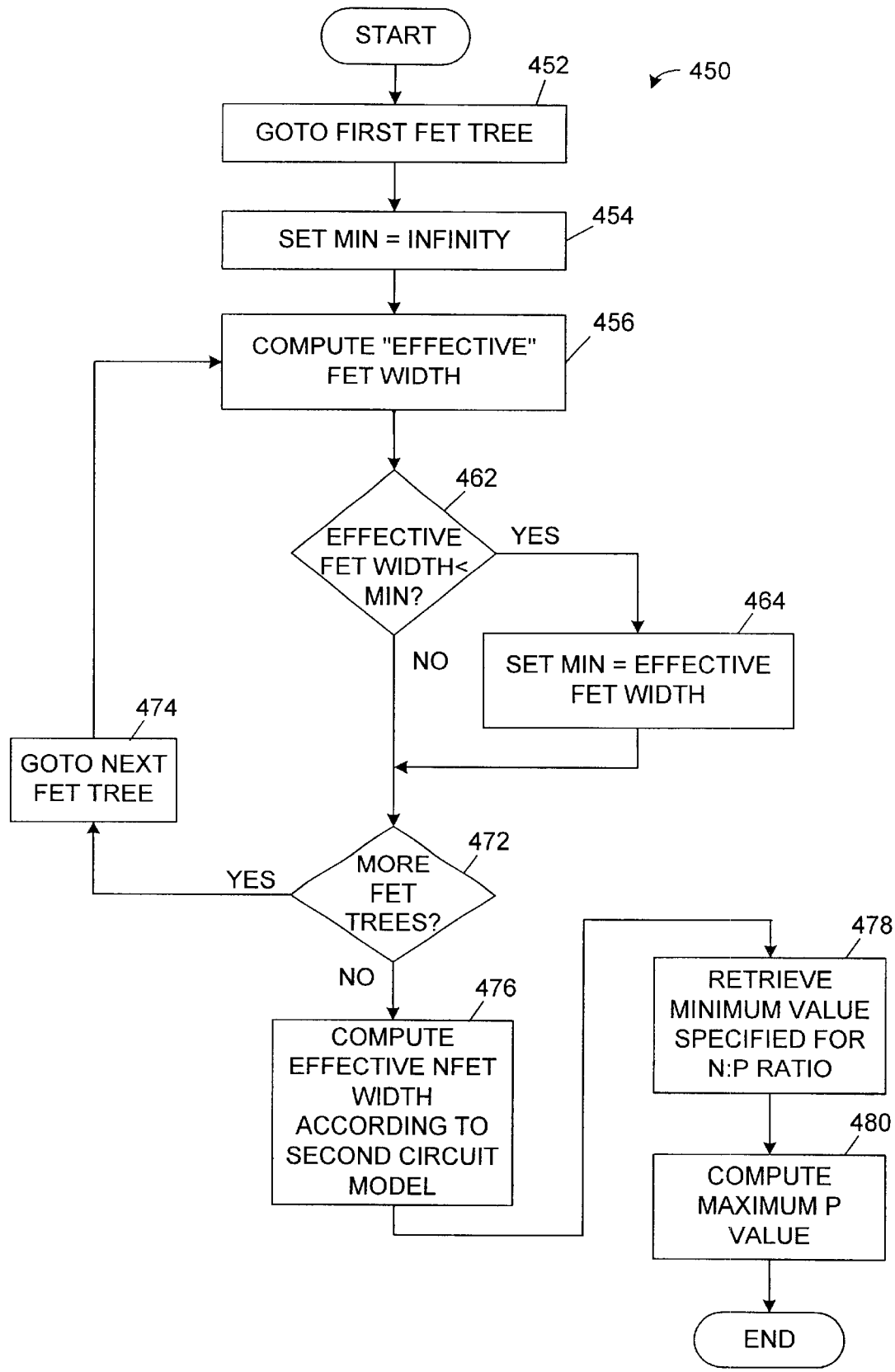
FIG. 14 is a flowchart illustrating a top level functional operation of a method for determining the maximum FET width for a feedback FET, in accordance with the invention.

Having illustrated various circuit configurations and circuit models relevant to the present invention, reference is now made to FIG. 13, which is a flow chart 400 illustrating the top level functional operation of the evaluation carried out by the present invention, in connection with the determination of the minimum FET width of a feedback FET to a precharge node. In this regard, the method illustrated in FIG. 13 begins by proceeding to a first FET tree (Step 402). Assuming that a precharge node has been identified, there will be at least one NFET tree associated with that node, and therefore the method may proceed immediately to a first FET tree. As previously mentioned, the minimum FET width of a feedback FET is computed, in part, by summing the individual FET width values of the largest NFET in each NFET tree associated with the precharge node. Therefore, the procedure may begin by setting both a summation value and a current size variable value to zero (Step 404). The current size variable holds the FET width of the largest FET in a given FET tree. The method may then proceed to a first FET in the current FET tree (Step 406).

In evaluating the FETs, the method may determine whether the current FET is an evaluation FET (Step 408). As previously mentioned, an evaluation FET may be determined by detecting a clock signal applied to the gate node of the FET. If the current FET is not an evaluation FET, then the method may determine whether the FET width of the current FET is greater than the value of the current size variable (Step 410). Of course, the FET width of the first FET in any FET tree will always be greater than the current size variable, and therefore the value of the current size variable will set equal to this FET width value (Step 411). Thereafter, in subsequent passes through the flowchart for other FETs, the value of the current size variable will be updated only as necessary to retain the value of the largest FET width in the FET tree. Again, and as previously mentioned, for complex FET tree structures effective FET width computations may be made. However, such contingencies are not deemed to be significant to the illustration of the principal features of the present invention, and so they have not been specifically depicted or described herein.

Thereafter, the method may determine whether there are more FETs in the current FET tree (Step 412). If so, the method may proceed to the next FET (Step 414), and return to the evaluation of Step 408, as described above. The execution of Steps 408–414 may be repeated until the evaluation of Step 412 resolves to NO. Once it is determined that there are no more FETs in a current FET tree, then the method may evaluate whether there are more FET trees associated with the precharge node (Step 416). If so, the method proceeds to the next FET tree (Step 418), sets the sum equal to the previous sum value and the current size value, resets the current size variable value to zero (step 419), and returns to Step 406. From there, the widths of the FETs in the next FET tree will be summed into the running summation of all the FETs associated with the precharge node.

When, however, the evaluation of Step 416 resolves to no, then all FET widths of the NFETs associated with the precharge node will have been summed together. Then, the method may retrieve a maximum value for an N:P ratio. Specifically, this ratio defines the maximum value of NFET widths to PFET widths as illustrated in the first circuit model shown in FIG. 11. As illustrated in the first example discussed previously, assuming that the NFET widths sum to a value of 64, and the predetermined maximum value (R), as may be set by a design engineer, is equal to 5, then the minimum value of P (the PFET width) may be computed as P=N/R=64/5=12.8 microns (Step 422).

Once the minimum value of the PFET width has been computed, then the method of the present invention may compute the maximum value for the PFET width. In this regard, reference is made to FIG. 14, which is a flow chart 450 illustrating the top level functional operation of this aspect of the present invention. Specifically, unlike the method associated with FIG. 13 wherein the width value of the largest NFETs of each FET tree are summed together, in the evaluation of the second circuit model, each NFET tree is evaluated separately. Specifically, and "effective" FET width may be calculated for each NFET tree. The smallest "effective" FET width is then evaluated in comparison to a stored N:P ratio in order to compute the maximum width of the feedback PFET. The reason for this evaluation is that the present invention ensures that if only one NFET tree fires (or turns on) that the strength of that NFET tree is sufficient to pull down the value at the precharge node. The worst case scenario (e.g., the weakest path being the only path to turn on), is the one having the smallest effective FET width.

Accordingly, the method may begin by proceeding to a first FET tree 452, and set a temporary variable such as "Min" to infinity (e.g., setting the variable to the largest floating point value supported by the software or computation device) (Step 454). This "Min" variable holds the value of the largest effective FET width for the various NFET trees. Thereafter, the method may compute the effective FET width for the current FET tree (Step 456). It should be appreciated that this calculation may be somewhat involved. In general, two NFETs that are channel connected in series combine to form an NFET having an effective width that is equal to the product of the two NFET widths, divided by the sum of the two NFET widths. However, as more complex NFET structures are presented, this computation necessarily becomes more complex.

By way of illustration, two NFETs connected in channel-parallel fashion, may be deemed equivalent to a single NFET having an effective FET width of the smaller of the two FETs. Further, consider a configuration (not shown) of three NFETs, wherein two NFETs are connected in channel series fashion, and the third NFET is connected in channel parallel fashion across the two series disposed FETs. An equivalent NFET may be computed by calculating the effective FET width of the two series connected FETs, by computing the product of their individual FET widths, divided by the sum of their individual FET widths. This interim value may then be compared to the FET width of the third (parallel) FET, whereby the overall effective FET width may be estimated as the smaller value as between the third FET width and the interim value.

As yet further, more complex NFET structures are presented, similar computation strategies may be employed for computing an overall effective FET width for each NFET tree. Since the specific manner of this computation is not deemed to be necessary for carrying out the broader aspects of the present invention, no specific algorithm for this computation need be provided and described herein. Indeed, this computation may be carried out in more than one way, consistent with the present invention.

After computing the effective FET width of a current FET tree, this effective FET width may be compared to the value of the Min variable (Step 462). If the current FET width value is less than the Min variable value, then the Min variable value may be set to equal the effective FET width (Step 464).

The method may then determine whether there are more FET trees to be evaluated (Step 472). If so, it proceeds to the next FET tree (Step 474) and returns to Step 456, and continues from there in the same manner as described above. Once the execution has reached a point where there are no more FET trees to be evaluated, then the method proceeds to compute the maximum width value of the feedback FET. This value will be in part computed based upon the effective width of the NFETs, which are computed in accordance with the equation: P2=N2/R2, where P2 is the maximum width value of the feedback FET. R2 is the specified minimum for the N2:P2 ratio, and N2 (N2 is the Min variable value) is computed from the equation discussed above (i.e., N2=1/((1/w1)+(1/w2)+ . . . +(1/wn))), which represents the smallest effective FET tree.

From the value of N (the effective width of the NFETs in the minimum NFET tree), and a predefined minimum value of the N:P ratio, the value the maximum width for the feedback PFET can be computed. Therefore, the method may retrieve a minimum specified value for the N:P ratio (Step 478), and then compute the maximum P value (Step 480).

While the invention has been described above in connection with a method for evaluating a netlist, it will be appreciated that, in accordance with another aspect of the invention, a system may also be provided. Preferably, the system will be provided, in part, in the form of a computer readable storage medium that is configured to execute on a computer having a processor.

Figure 15:
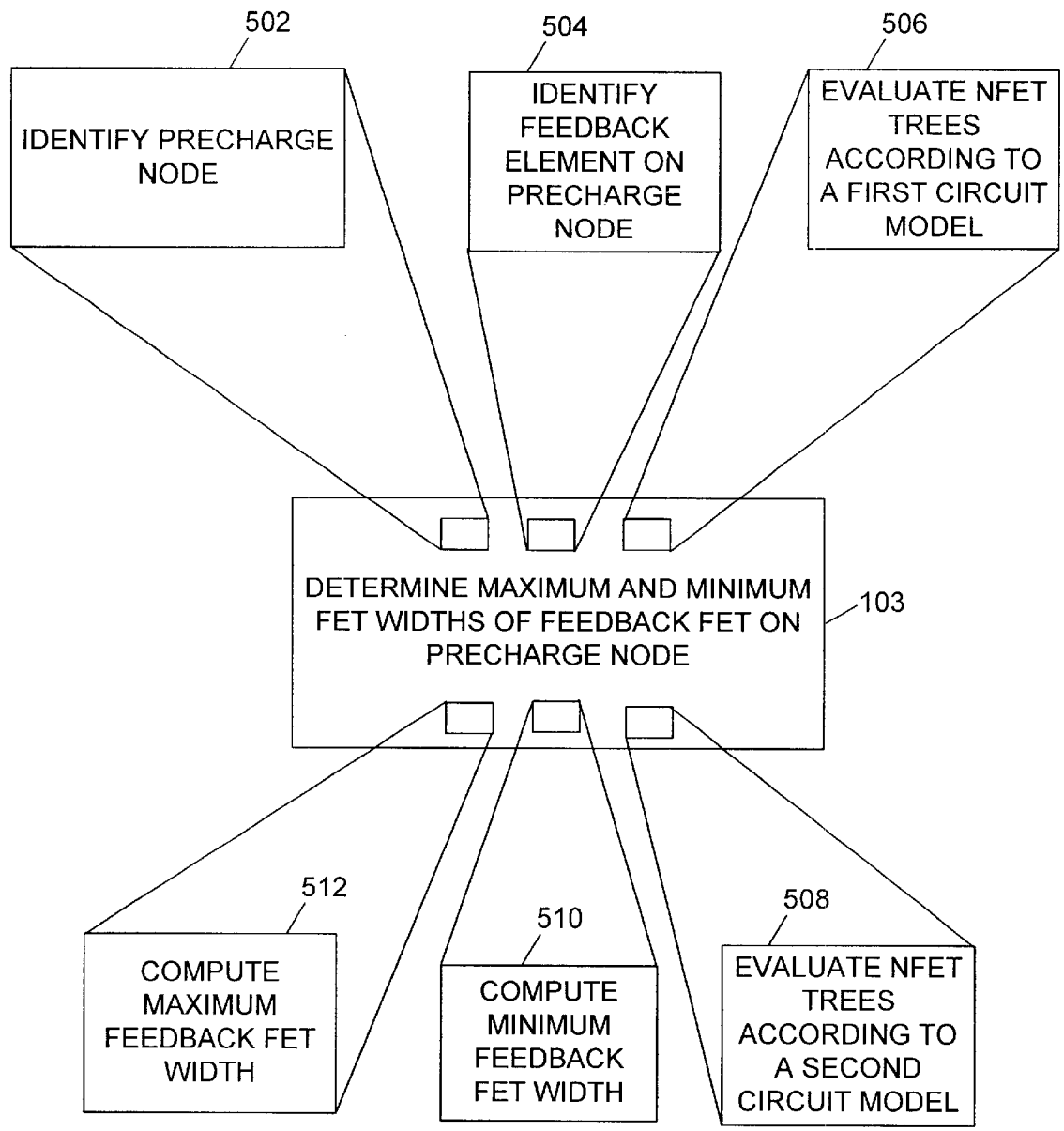
FIG. 15 is a block diagram illustrating certain fundamental code segments comprising a system constructed in accordance with the invention

In this regard, reference is now made to FIG. 15 which illustrates certain functions which may be carried out by a system that is configured to evaluate a circuit netlist for errors, constructed in accordance with the teachings of the invention. For example, the system may include a plurality of code segments that perform a variety of individual functions. For example, one segment 502 may be configured to identify a precharge node. Another segment 504 may be configured to identify a feedback element on a precharge node. Another segment 506 may be configured to evaluate NFET trees according to a first circuit model, and use this computation in connection with computing a minimum width for a feedback FET (segment 510). Yet another segment 508 may be configured to evaluate NFET trees according to a second circuit model, and use this computation in connection with computing a maximum width for a feedback FET (segment 512). Yet additional segments (not illustrated) may be provided in connection with the system of the present invention. As will be appreciated by persons of skill in the art in light of the teachings provided herein.

In should be appreciated that the flow charts of FIGS. 3, 6, 13, and 14 show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 3, 6, 13, and 14. For example, two blocks shown in succession may in fact be executed substantially concurrently or the blocks may sometimes be executed in the reverse order, depending upon the functionality involved.

It should be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. A method for determining a maximum FET width and a minimum FET width for a feedback FET on a precharge node, comprising the steps of:

identifying a precharge node;

detecting a feedback FET tree on the precharge node;

evaluating at least one NFET tree, in accordance with a first circuit model, to determine an effective NFET width (N) of FETs in the at least one NFET tree;

computing a minimum value of a PFET width (P) for the feedback FET tree, for a specified N:P ratio;

evaluating the at least one NFET tree, in accordance with a second circuit model, to determine an effective NFET width (N2) of the FETs in the at least one NFET tree; and computing a maximum value of an effective PFET width (P2) for the feedback FET tree, for a specified N2:P2 ratio.

2. The method as defined in claim 1, wherein the step of detecting a feedback FET tree more specifically includes detecting at least one feedback PFET, the feedback FET tree being an effective FET including at least one PFET.

3. The method as defined in claim 1, wherein the step of evaluating at least one NFET tree, in accordance with a first circuit model, to determine an effective NFET width (N), includes approximating an effective FET width to be equal to the FET width of the largest FET in the at least one NFET tree.

4. The method as defined in claim 3, further including the step of determining whether a given, individual NFET is an evaluation FET.

5. The method as defined in claim 4, wherein the step of approximating an effective FET width more specifically includes ignoring the value of those NFETs determined to be evaluation FETs.

6. The method as defined in claim 1, wherein the step of computing a minimum value of a PFET width (P) more particularly includes retrieving the specified (N:P) ratio, wherein the specified N:P ratio is a design ratio that is specified by a user of the method.

7. The method as defined in claim 1, wherein the step of evaluating at least one NFET tree, in accordance with a second circuit model, to determine an effective NFET width (N), includes combining series connected FETs by dividing the product of their widths by the sum of their widths, and further includes combining parallel connected FETs by approximating an effective width equal to a larger width value of the channel parallel connected FETs.

8. The method as defined in claim 7, wherein the step of evaluating at least one NFET tree, in accordance with a second circuit model, to determine an effective NFET width (N), includes accumulating width values of individual NFETs in accordance with the following equation:

$$N2=1/((1/w1)+(1/w2)+ \ldots +(1/wn)).$$

where w1, w2, . . . , wn are width values for a first NFET, a second NFET, . . . , and an nth NFET in the NFET tree identified as having the maximum width summation.

9. The method as defined in claim 7, wherein the step of evaluating at least one NFET tree, in accordance with a second circuit model, to determine an effective NFET width (N), includes accumulating width values of individual NFETs in accordance with the following equation:

$$N2=Lp/((L1/w1)+(L2/w2)+ \ldots +(Ln/wn)),$$

where w1, w2, . . . , wn are width values for a first NFET, a second NFET, . . . , and an nth NFET, where Lp is a FET length specified by a fabrication process, and L1, L2, . . . , Ln are FET length values for the first NFET, the second NFET, . . . , and the nth NFET, in the NFET tree identified as having the maximum width summation.

10. The method as defined in claim 1, further including the step of determining whether the FET width of the feedback FET tree exceeds the value P, and generating a warning message if it does.

11. The method as defined in claim 1, further including the step of determining whether the FET width of the feedback FET tree is smaller than the value P2, and generating a warning message if it does.

12. A method for determining a minimum FET width for a feedback FET on a precharge node, comprising the steps of:

summing width values of individual NFETs in at least one NFET tree associated with the precharge node, to determine an effective NFET width (N) of NFETs in the at least one NFET tree; and computing a minimum value of a PFET width (P) for the teedback FET, for a specified N:P ratio (R), in accordance with the equation: P=N/R.

13. The method as defined in claim 12, further including the step of determining whether a given, individual NFET is an evaluation FET.

14. The method as defined in claim 13, wherein the step of summing width values more specifically includes summing width values of the largest NFET in each of the at least one NFET tree, except those NFETs determined to be evaluation FETs.

15. The method as defined in claim 12, further including the step of determining whether a FET width of the feedback FET exceeds the minimum FET width value, and generating a warning message if it does.

16. A method for determining a maximum FET width for a feedback FET on a precharge node, comprising the steps of:

evaluating at least one NFET tree, in accordance with a first circuit model, to determine an effective NFET width (N), including combining series connected FETs by dividing the product of their widths by the sum of their widths, and further includes combining parallel connected FETs by approximating an effective width equal to a larger width value of the channel parallel connected FETs;

accumulating width values of individual NFETs in the at least one NFET tree associated with the precharge node to determine an effective NFET width (N2) of NFETs in the at least one NFET tree; and computing a maximum value of an effective PFET width (P2) for the feedback FET tree, for a specified N2:P2 ratio (R2), in accordance with the equation P2=N2/R2.

17. The method as defined in claim 16, wherein the step of accumulating width values of individual NFETs in the at least one NFET tree, accumulates the value N2 in accordance with the following equation:

$$N2=1/((1/w1)+(1/w2)+ \ldots +(1/wn)),$$

where w1, w2, . . . , wn are width values for a first NFET, a second NFET, . . . , and an nth NFET in the NFET tree identified as having the maximum width summation.

18. The method as defined in claim 16, wherein the step of accumulating width values of individual NFETs in the at least one NFET tree, accumulates the value N2 in accordance with the following equation:

$$N2=Lp/((L1/w1)+(L2/w2)+ \ldots +(Ln/wn)),$$

where w1, w2, . . . , wn are width values for a first NFET, a second NFET, . . . , and an nth NFET, where Lp is a FET length specified by a fabrication process, and L1, L2, . . . , Ln are FET length values for the first NFET, the second NFET, . . . , and the nth NFET, in the NFET tree identified as having the maximum width summation.

19. The method as defined in claim 16, further including the step of determining whether a FET width of the feedback FET is smaller than the minimum FET width value, and generating a warning message if it does.

* * * * *